United States Patent
Lin et al.

(10) Patent No.: US 10,573,615 B2
(45) Date of Patent: Feb. 25, 2020

(54) SEMICONDUCTOR PACKAGE AND METHOD FOR FABRICATING BASE FOR SEMICONDUCTOR PACKAGE

(71) Applicant: MediaTek Inc., Hsin-Chu (TW)

(72) Inventors: Tzu-Hung Lin, Zhubei (TW); Wen-Sung Hsu, Zhubei (TW); Ta-Jen Yu, Taichung (TW); Andrew C. Chang, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 14/173,976

(22) Filed: Feb. 6, 2014

(65) Prior Publication Data
US 2014/0151867 A1    Jun. 5, 2014

Related U.S. Application Data

(62) Division of application No. 13/721,983, filed on Dec. 20, 2012, now Pat. No. 9,177,899.
(Continued)

(51) Int. Cl.
*H01L 23/00* (2006.01)
*H01L 49/02* (2006.01)
(Continued)

(52) U.S. Cl.
CPC .............. *H01L 24/13* (2013.01); *H01L 21/48* (2013.01); *H01L 23/498* (2013.01); *H01L 23/49541* (2013.01); *H01L 24/05* (2013.01); *H01L 24/14* (2013.01); *H01L 24/16* (2013.01); *H01L 24/29* (2013.01); *H01L 24/32* (2013.01); *H01L 24/73* (2013.01); *H01L 28/00* (2013.01); *H05K 1/111* (2013.01); *H01L 23/49811* (2013.01);
(Continued)

(58) Field of Classification Search
CPC ......... H01L 24/05; H01L 24/13; H01L 24/14; H01L 24/16; H01L 24/29; H01L 24/73; H01L 28/00; H01L 23/498; H01L 23/49541; H01L 21/48
See application file for complete search history.

(56) References Cited

U.S. PATENT DOCUMENTS 3,925,297 A * 12/1975 Sprengling ................ C08J 5/08
                                                           523/200
6,093,972 A *  7/2000 Carney et al. ................ 257/790
(Continued)

FOREIGN PATENT DOCUMENTS

CN      101286491 A     10/2008
CN      101477971       7/2009
(Continued)

OTHER PUBLICATIONS

English language translation of abstract of TW 201042744 (pp. 2-3 of publication, published Dec. 1, 2010).
(Continued)

*Primary Examiner* — Marcos D. Pizarro
(74) *Attorney, Agent, or Firm* — Wolf, Greenfield & Sacks, P.C.

(57) ABSTRACT

The invention provides a semiconductor package and a method for fabricating a base for a semiconductor package. The semiconductor package includes a conductive trace embedded in a base. A semiconductor device is mounted on the conductive trace via a conductive structure.

21 Claims, 14 Drawing Sheets

Related U.S. Application Data

(60) Provisional application No. 61/677,835, filed on Jul. 31, 2012.

(51) Int. Cl.
*H01L 23/498* (2006.01)
*H01L 21/48* (2006.01)
*H05K 1/11* (2006.01)
*H01L 23/495* (2006.01)
*H05K 3/34* (2006.01)

(52) U.S. Cl.
CPC ......... *H01L 23/49827* (2013.01); *H01L 24/11* (2013.01); *H01L 24/81* (2013.01); *H01L 2224/0345* (2013.01); *H01L 2224/0346* (2013.01); *H01L 2224/0401* (2013.01); *H01L 2224/05022* (2013.01); *H01L 2224/05073* (2013.01); *H01L 2224/05124* (2013.01); *H01L 2224/05147* (2013.01); *H01L 2224/05562* (2013.01); *H01L 2224/05572* (2013.01); *H01L 2224/05573* (2013.01); *H01L 2224/05647* (2013.01); *H01L 2224/05666* (2013.01); *H01L 2224/11462* (2013.01); *H01L 2224/11849* (2013.01); *H01L 2224/131* (2013.01); *H01L 2224/1308* (2013.01); *H01L 2224/13026* (2013.01); *H01L 2224/13083* (2013.01); *H01L 2224/13147* (2013.01); *H01L 2224/13155* (2013.01); *H01L 2224/16235* (2013.01); *H01L 2224/16237* (2013.01); *H01L 2224/16238* (2013.01); *H01L 2224/3224* (2013.01); *H01L 2224/73204* (2013.01); *H01L 2224/81191* (2013.01); *H01L 2224/81815* (2013.01); *H01L 2924/00014* (2013.01); *H01L 2924/12042* (2013.01); *H05K 3/3436* (2013.01); *H05K 2201/0376* (2013.01); *H05K 2201/09472* (2013.01); *H05K 2201/10674* (2013.01); *Y02P 70/611* (2015.11)

(56) References Cited

U.S. PATENT DOCUMENTS

| | | | |
|---|---|---|---|
| 6,510,976 B2 | 1/2003 | Hwee et al. | |
| 6,550,666 B2 | 4/2003 | Chew et al. | |
| 6,734,039 B2 | 5/2004 | Tan et al. | |
| 6,750,082 B2 | 6/2004 | Briar et al. | |
| 6,929,981 B2 | 8/2005 | Tan et al. | |
| 7,456,496 B2 | 11/2008 | Tan et al. | |
| 7,462,942 B2 | 12/2008 | Tan et al. | |
| 7,791,211 B2 | 9/2010 | Chen et al. | |
| 7,795,071 B2 | 9/2010 | Chew et al. | |
| 7,939,939 B1 | 5/2011 | Zeng et al. | |
| 8,017,442 B2 | 9/2011 | Hsu | |
| 8,058,105 B2 | 11/2011 | Hsu | |
| 8,148,822 B2 | 4/2012 | Lin et al. | |
| 8,207,608 B2 | 6/2012 | Chew et al. | |
| 8,288,871 B1 | 10/2012 | Shieh et al. | |
| 9,177,899 B2 | 11/2015 | Lin et al. | |
| 2002/0092672 A1 | 7/2002 | Primavera | |
| 2002/0105789 A1 | 8/2002 | Chen et al. | |
| 2003/0193094 A1 | 10/2003 | Takahashi et al. | |
| 2004/0053483 A1* | 3/2004 | Nair | H01L 21/2885 438/540 |
| 2004/0108580 A1 | 6/2004 | Tan et al. | |
| 2004/0154162 A1 | 8/2004 | Lee et al. | |
| 2004/0077124 A1 | 10/2004 | Ogawa | |
| 2005/0001329 A1 | 1/2005 | Matsuki et al. | |
| 2005/0087883 A1 | 4/2005 | Hwee et al. | |
| 2006/0060937 A1 | 3/2006 | Lim et al. | |
| 2006/0103016 A1 | 5/2006 | Tan et al. | |
| 2006/0121256 A1 | 6/2006 | Kim et al. | |
| 2006/0180888 A1 | 8/2006 | Tan et al. | |
| 2006/0186524 A1 | 8/2006 | Aiba et al. | |
| 2006/0192287 A1 | 8/2006 | Ogawa et al. | |
| 2006/0216860 A1 | 9/2006 | Pendse | |
| 2007/0196979 A1 | 8/2007 | Tan et al. | |
| 2007/0284420 A1 | 12/2007 | Tan et al. | |
| 2008/0145967 A1 | 6/2008 | Chew et al. | |
| 2008/0150107 A1 | 6/2008 | Tan et al. | |
| 2008/0150561 A1 | 6/2008 | Chew et al. | |
| 2008/0246146 A1 | 10/2008 | Kodani et al. | |
| 2008/0248610 A1 | 10/2008 | Hwee et al. | |
| 2009/0079094 A1 | 3/2009 | Lin | |
| 2009/0102043 A1 | 4/2009 | Chew et al. | |
| 2009/0166849 A1 | 7/2009 | Jao et al. | |
| 2009/0291530 A1 | 11/2009 | Chew et al. | |
| 2010/0073894 A1 | 3/2010 | Mortensen et al. | |
| 2010/0105173 A1* | 4/2010 | Fujimori | H01L 24/11 438/121 |
| 2010/0147574 A1 | 6/2010 | Kaneko et al. | |
| 2010/0175917 A1 | 7/2010 | Miyasaka et al. | |
| 2010/0258953 A1 | 10/2010 | Takeda | |
| 2010/0264526 A1 | 10/2010 | Chew et al. | |
| 2011/0049708 A1 | 3/2011 | Lim et al. | |
| 2011/0097850 A1 | 4/2011 | Hsu | |
| 2011/0101526 A1* | 5/2011 | Hsiao et al. | 257/738 |
| 2011/0133342 A1* | 6/2011 | Arai | B81C 1/0023 257/774 |
| 2011/0169164 A1 | 7/2011 | Nakamura et al. | |
| 2011/0177686 A1 | 7/2011 | Zeng et al. | |
| 2011/0248399 A1 | 10/2011 | Pendse | |
| 2011/0267789 A1 | 11/2011 | Chew et al. | |
| 2011/0304058 A1 | 12/2011 | Pendse | |
| 2012/0058604 A1 | 3/2012 | Chew et al. | |
| 2012/0220118 A1 | 8/2012 | Chew et al. | |
| 2012/0228780 A1 | 9/2012 | Kim et al. | |
| 2012/0267779 A1 | 10/2012 | Lin et al. | |
| 2012/0286423 A1 | 11/2012 | Cheng et al. | |
| 2012/0326299 A1* | 12/2012 | Topacio | H01L 23/3171 257/737 |
| 2013/0020710 A1 | 1/2013 | Chew et al. | |
| 2013/0062755 A1 | 3/2013 | Kuo et al. | |
| 2013/0087366 A1 | 4/2013 | Michael et al. | |
| 2013/0093076 A1 | 4/2013 | Lin et al. | |
| 2013/0113099 A1 | 5/2013 | Lim et al. | |
| 2013/0127054 A1 | 5/2013 | Muthukumar et al. | |
| 2013/0161776 A1 | 6/2013 | Iizuka | |
| 2013/0161809 A1 | 6/2013 | Chew et al. | |
| 2013/0175707 A1 | 7/2013 | Chew et al. | |
| 2014/0035095 A1 | 2/2014 | Lin et al. | |
| 2014/0131856 A1 | 5/2014 | Do et al. | |
| 2014/0191396 A1 | 7/2014 | Lin et al. | |
| 2015/0061143 A1 | 5/2015 | Kim et al. | |
| 2015/0145131 A1 | 5/2015 | Yoo et al. | |
| 2016/0307861 A1 | 10/2016 | Lin et al. | |
| 2016/0358877 A1 | 12/2016 | Chou et al. | |
| 2017/0133310 A1 | 5/2017 | Kelly et al. | |

FOREIGN PATENT DOCUMENTS

| | | |
|---|---|---|
| CN | 100530608 C | 8/2009 |
| CN | 101728337 A | 6/2010 |
| CN | 101958289 A | 1/2011 |
| CN | 102054811 A | 5/2011 |
| CN | 102760712 | 10/2012 |
| CN | 103579169 A | 2/2014 |
| CN | 104904006 A | 9/2015 |
| JP | H05-267393 A | 10/1993 |
| KR | 2007-0107154 A | 11/2007 |
| KR | 10-2010-0033953 | 3/2010 |
| KR | 10-2011-0047127 | 5/2011 |
| KR | 2011-0135329 A | 12/2011 |
| TW | 200623997 | 7/2006 |
| TW | 200915452 A | 4/2009 |
| TW | 200929467 | 7/2009 |
| TW | 201042744 | 12/2010 |
| TW | 201115655 | 5/2011 |
| TW | I364101 | 5/2012 |
| TW | 201222752 | 6/2012 |
| TW | 201405728 A | 2/2014 |

(56) References Cited

FOREIGN PATENT DOCUMENTS

| TW | 201430967 A | 8/2014 |
| TW | 201523835 A | 6/2015 |
| WO | WO 02/23631 A2 | 3/2002 |
| WO | WO 2016/094721 A1 | 6/2016 |

OTHER PUBLICATIONS

Office Action dated Sep. 6, 2015 from corresponding Chinese Patent Application No. 201310286640.9.
Office Action dated Dec. 17, 2015 for Taiwan Application No. 10421708800.
Office Action dated Jul. 26, 2016 from Korean Application No. 10-2015-7019713.
Extended European Search Report for Application No. EP 13863897.8 dated Jul. 28, 2016.
Lutzow et al., Recyclable Anisotropic Etchant for Advanced Flip Chip Manufacturing (Green). Microsystems, Packaging, Assembly and Circuits Technology Conference. Oct. 2012: 110-3.
Semiconductor Manufacturing Technology. Michael Quirk, Julian Serda. 2001. p. 438 Prentice Hall Inc.
Third-Party Pre-Issuance Submission filed by a third party in the present application on or about Aug. 5, 2015.
Koh et al., Copper Pillar Bump Technology Progress Overview, 12th International Conference on Electronic Packaging Technology and High Density Packaging, Aug. 1, 2011, pp. 1137-1137.
International Search Report and Written Opinion dated Mar. 27, 2014 in connection with International Application No. PCT/CN2013/089940.
U.S. Appl. No. 14/205,880, filed Mar. 12, 2014, Lin et al.
U.S. Appl. No. 15/194,658, filed Jun. 28, 2016, Lin et al.
13863897.8, dated Jul. 28, 2016, Extended European Search Report.

\* cited by examiner

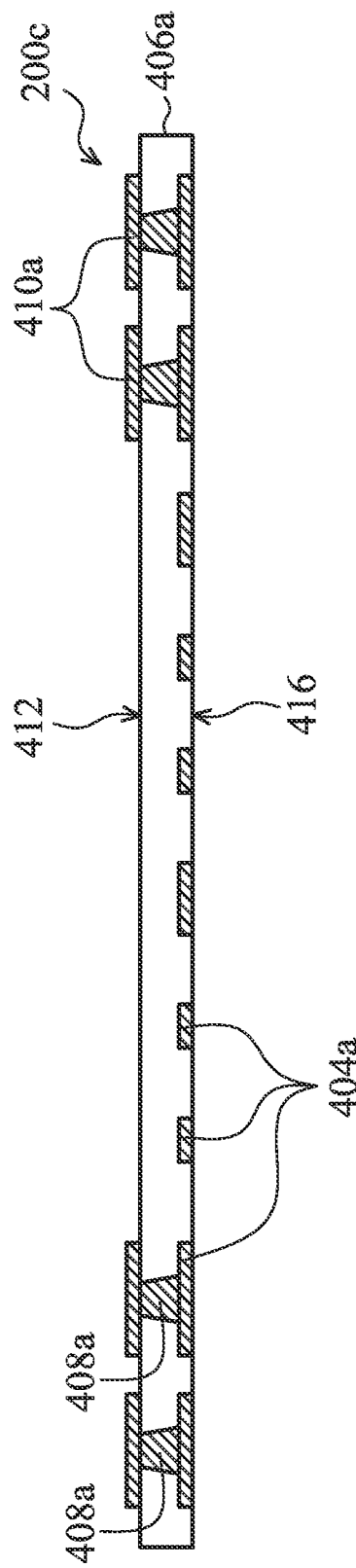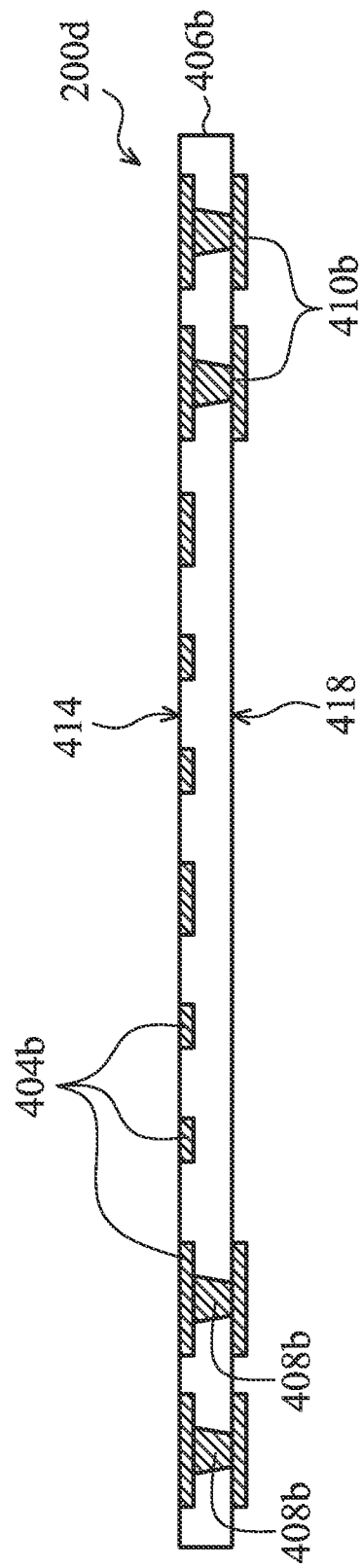
FIG. 5d
FIG. 5e

SEMICONDUCTOR PACKAGE AND METHOD FOR FABRICATING BASE FOR SEMICONDUCTOR PACKAGE

CROSS REFERENCE TO RELATED APPLICATIONS

This application is a divisional of pending U.S. application Ser. No. 13/721,983, filed on Dec. 20, 2012, which claims the benefit of U.S. Provisional Application No. 61/677,835, filed on Jul. 31, 2012, the entireties of which are incorporated by reference herein.

BACKGROUND OF THE INVENTION

Field of the Invention

The present invention relates to a semiconductor package and a method for fabricating a base for a semiconductor package, and in particular, to a base for a high density semiconductor package.

Description of the Related Art

In order to ensure miniaturization and multi-functionality of electronic products or communication devices, semiconductor packages are desired to be small in size, to support multi-pin connection, to support high speeds, and to support high functionality. The demand for increasing Input-Output (I/O) pin counts and high-performance ICs has led to the development of flip chip packages.

Flip-chip technology uses bumps on a chip to interconnect to a package substrate. The flip-chip is bonded face down to the package substrate through the shortest path. The technology used can be applied not only to a single-chip package, but also to higher or integrated levels of packaging in which the packages are larger and packaged with more sophisticated substrates that accommodate several chips to form larger functional units. The flip-chip technique, using an area array, can achieve a high density interconnection with devices and a very low inductance interconnection with packaging. However, this requires printed circuit board (PCB) fabricators to minimize line widths and space or to develop direct chip attach (DCA) semiconductors. Accordingly, the increased amount of input/output connections of a multi-functional flip-chip package may induce thermal electrical problems, for example, problems with heat dissipation, cross talk, signal propagation delay, electromagnetic interference for RF circuits, etc. The thermal electrical problems may affect the reliability and quality of products.

Thus, a novel high-density flip chip package and a printed circuit board for a high-density flip chip package are desirable.

BRIEF SUMMARY OF INVENTION

A semiconductor package and a method for fabricating a base for a semiconductor package are provided. An exemplary embodiment of a semiconductor package includes a conductive trace embedded in a base. A semiconductor device is mounted on the conductive trace via a conductive structure.

Another exemplary embodiment of a semiconductor package includes a conductive trace, having a bottom surface and at least a portion of a sidewall connected to a base. A semiconductor device is mounted on the conductive trace via a conductive structure.

An exemplary embodiment of a method for fabricating a base for a semiconductor package includes providing a carrier with conductive seed layers on a top surface and a bottom surface of the carrier. First conductive traces are respectively formed on the top surface and the bottom surface of the carrier, connecting to the conductive seed layers. A first base material layer and a second base material layer are respectively laminated on the top surface and the bottom surface of the carrier, covering the first conductive traces. Second conductive traces are respectively formed on first surfaces of the first base material layer and the second base material layer, wherein the first surfaces of the first base material layer and the second base material layer are respectively away from the top surface and the bottom surface of the carrier. The first base material layer with the first and second conductive traces thereon and the second base material layer with the first and second conductive traces thereon are separated from the carrier to form a first base and a second base.

Another exemplary embodiment of a method for fabricating a semiconductor package includes providing a base, forming a conductive trace on the base, further forming an additional insulation material on the base, and further defining patterns upon the additional insulation material, wherein the pattern is formed on at least one conductive trace.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIGS. 5a to 5e are cross sections showing one exemplary embodiment of a method for fabricating a base for a semiconductor package of the invention.

DETAILED DESCRIPTION OF INVENTION

Figure 1:
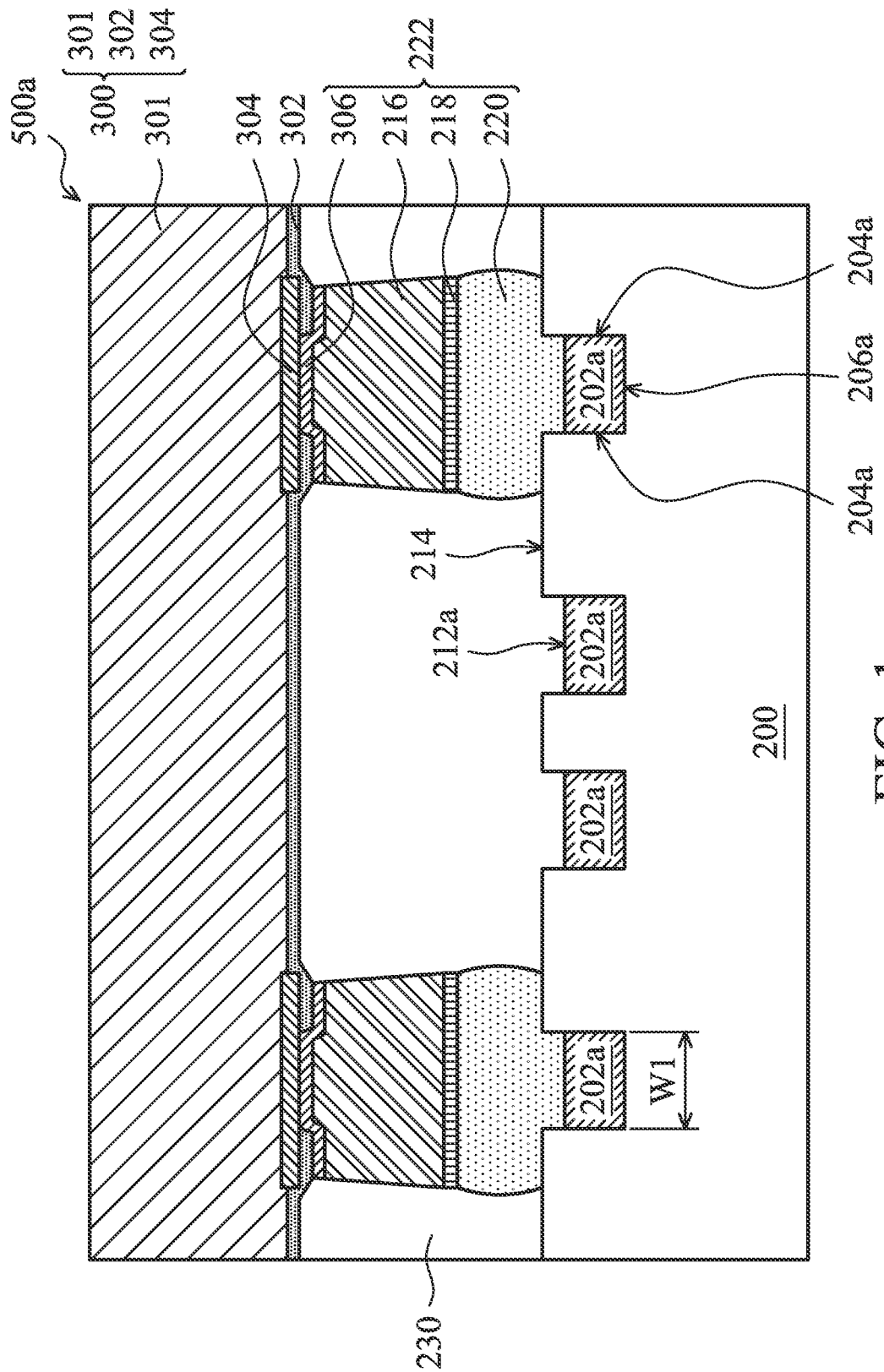
FIGS. 1 to 4 show cross sections of various exemplary embodiments of a semiconductor package of the invention.

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice of the invention.

FIGS. 1 to 4 show cross sections of various exemplary embodiments of a semiconductor package of the invention. In this embodiment, the semiconductor package can be a flip chip package using conductive structures, for example, copper pillar bumps, connecting a semiconductor device to a base. Alternatively, the semiconductor package can be a package using wire bonding technology to connect a semiconductor device to a base. FIG. 1 shows a partial cross section of one exemplary embodiment of a semiconductor package 500a of the invention. Please refer to FIG. 1, wherein the semiconductor package 500a comprises a base 200 having a device attach surface 214. In one embodiment, the base 200, for example, a print circuit board (PCB), may be formed of polypropylene (PP). It should be also noted that the base 200 can be a single layer or a multilayer structure. A plurality of conductive traces 202a is embedded in the base 200. In one embodiment, the conductive traces 202a may comprise signal trace segments or ground trace segments, which are used for input/output (I/O) connections of a semiconductor device 300 mounted directly onto the base 200. Therefore, each of the conductive traces 202a has a portion serving as a pad region of the base 200. In this embodiment, the conductive traces 202a are designed to have a width which is larger than 5 μm. However, it should be noted that there is no limitation on the width of the conductive traces. For different designs, the width of the conductive traces can be smaller than 5 μm if required.

A semiconductor device 300 is mounted on the device attach surface 214 of the base 200 with an active surface of the semiconductor device 300 facing the base 200 by a bonding process. In one embodiment, the semiconductor device 300 may comprise a die, a passive component, a package or a wafer level package. In this embodiment, the semiconductor device 300 is a flip chip package. A circuitry of the semiconductor device 300 is disposed on the active surface, and metal pads 304 are disposed on a top of the circuitry. The circuitry of the semiconductor device 300 is interconnected to the circuitry of the base 200 via a plurality of conductive structures 222 disposed on the active surface of the semiconductor device 300. However, it should be noted that the conductive structures 222 shown in FIG. 1 is only an example and is not a limitation to the present invention.

As shown in FIG. 1, the semiconductor device 300 may include a body 301, metal pads 304 overlying the semiconductor body 301, and an insulation layer 302 covering the metal pads 304. In this embodiment, the semiconductor body 301 may include but is not limited to a semiconductor substrate, circuit elements fabricated on the main surface of the semiconductor substrate, inter-layer dielectric (ILD) layers and an interconnection structure. In one embodiment, the interconnection structure may comprise a plurality of metal layers, a plurality of dielectric layers alternatively laminated with the metal layers and a plurality of vias formed through the dielectric layers on the semiconductor substrate. The metal pads 304 comprise the topmost metal layer of the metal layers of the interconnection structure. In one embodiment, the insulation layer 302 may be a single layer structure or a multilayer structure, and the insulation layer 302 may comprise but is not limited to silicon nitride, silicon oxide, silicon oxynitride, polyimide or any combination thereof. Also, the insulation layer 302 may have functions of stress buffering and insulation. In one embodiment, the metal pad 304 may comprise but is not limited to aluminum, copper or alloys thereof. A plurality of openings can be formed in the insulation layer 302. Each of the openings exposes at least a portion of one of the metal pads 304.

As shown in FIG. 1, the conductive structure 222 may comprise a conductive bump structure such as a copper bump or a solder bump structure, a conductive wire structure, or a conductive paste structure. In this embodiment, the conductive structure 222 may be a copper bump structure composed of a metal stack comprising a UBM (under bump metallurgy) layer 306, a copper layer 216 such as a plated copper layer, a conductive buffer layer 218, and a solder cap 220. In one embodiment, the UBM layer 306 can be formed on the exposed metal pads 304 within the openings by a deposition method such as a sputtering or plating method and a subsequent anisotropic etching process. The anisotropic etching process is performed after forming conductive pillars. The UBM layer 306 may also extend onto a top surface of the insulation layer 302. In this embodiment, the UBM layer 306 may comprise titanium, copper or a combination thereof. A copper layer 216 such as an electroplated copper layer can be formed on the UBM layer 306. The opening can be filled with the copper layer 216 and the UBM layer 306, and the copper layer 216 and the UBM layer 306 within the opening may form an integral plug of the conductive structure 222. A formation position of the copper layer 216 is defined by a dry film photoresist or liquid photoresist patterns (not shown).

A solder cap 220 can be formed on the copper layer 216 by electroplating a solder with a patterned photoresist layer or by a screen printing process and a subsequent solder re-flow process. A conductive buffer layer 218 formed of Ni may be formed between the copper layer 216 and the solder cap 220 by an electroplating method. The conductive buffer layer 218 may serve as a seed layer, adhesion layer and barrier layer for the solder cap 220 formed thereon. In this embodiment, the conductive structure 222, such as a conductive pillar structure, is used as a solder joint for the metal pad 304, which transmits input/output (I/O), ground or power signals of the semiconductor device 300 formed thereon. Therefore, the copper layer 216 of the conductive structure 222 may help to increase the mechanical strength of the bump structure. In one embodiment, an underfill material or the underfill 230 can be introduced into the gap between the semiconductor device 300 and the base 200. In one embodiment, the underfill 230 may comprises a capillary underfill (CUF), molded underfill (MUF) or a combination thereof.

In one embodiment, the conductive traces may have a top surface disposed above, below or aligned to a surface of the base to improve routing ability for high-density semiconductor packages. As shown in FIG. 1, the conductive traces 202a have top surfaces 212a disposed below a device attach surface 214 of the base 200. That is to say, a bottom surface 206a and at least a portion of a sidewall 204a of the conductive trace 202a are designed to be connected to the base 200. In this embodiment, the solder cap 220 of the conductive structure 222 is disposed to contact with a portion of the base 200 and to connect to a top surface 212a of the conductive trace 202a only. Due to the top surfaces of the conductive traces being recessed from the device attach surface 214 of the base 200, the bump-to-trace space is increased and the problem of bump-to-trace bridging can be effectively avoided.

Figure 2:
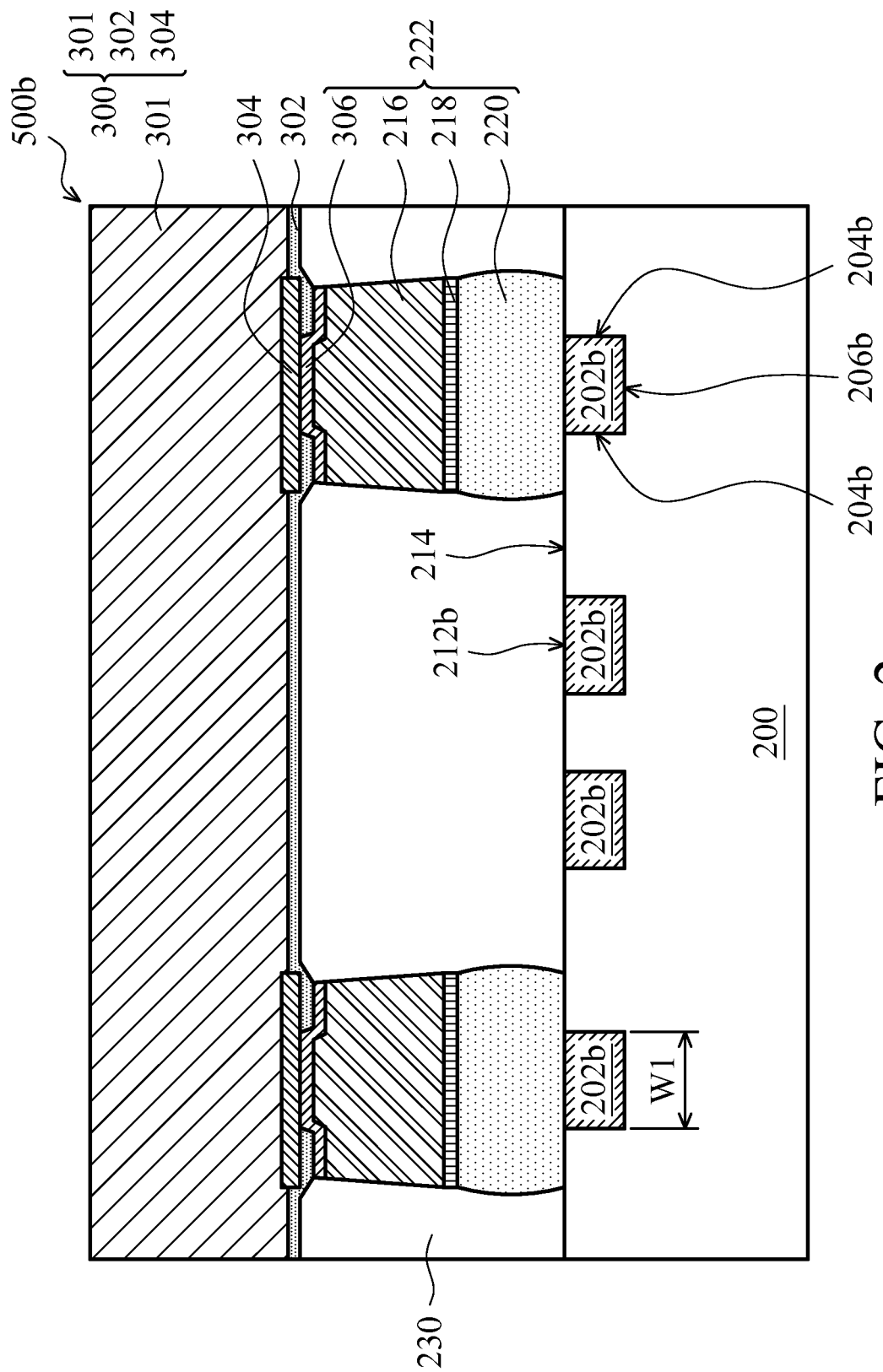

FIG. 2 shows a partial cross section of another exemplary embodiment of a semiconductor package 500b of the invention. Elements of the embodiments that are the same or similar as those previously described with reference to FIG. 1, are hereinafter not repeated for brevity. In this embodiment, conductive traces 202b of the semiconductor package 500b embedded in the base 200 may have a top surface 212b designed to be aligned to a device attach surface 214 of the base 200 to improve routing ability for high-density semiconductor packages. That is to say, a bottom surface 206b and a sidewall 204b of the conductive trace 202b are designed to be fully connected to the base 200. Therefore, the solder cap 220 of the conductive structure 222 is disposed on the device attach surface 214 of the base 200, contacting the top surface 212b of the conductive trace 202b only.

Figure 3:
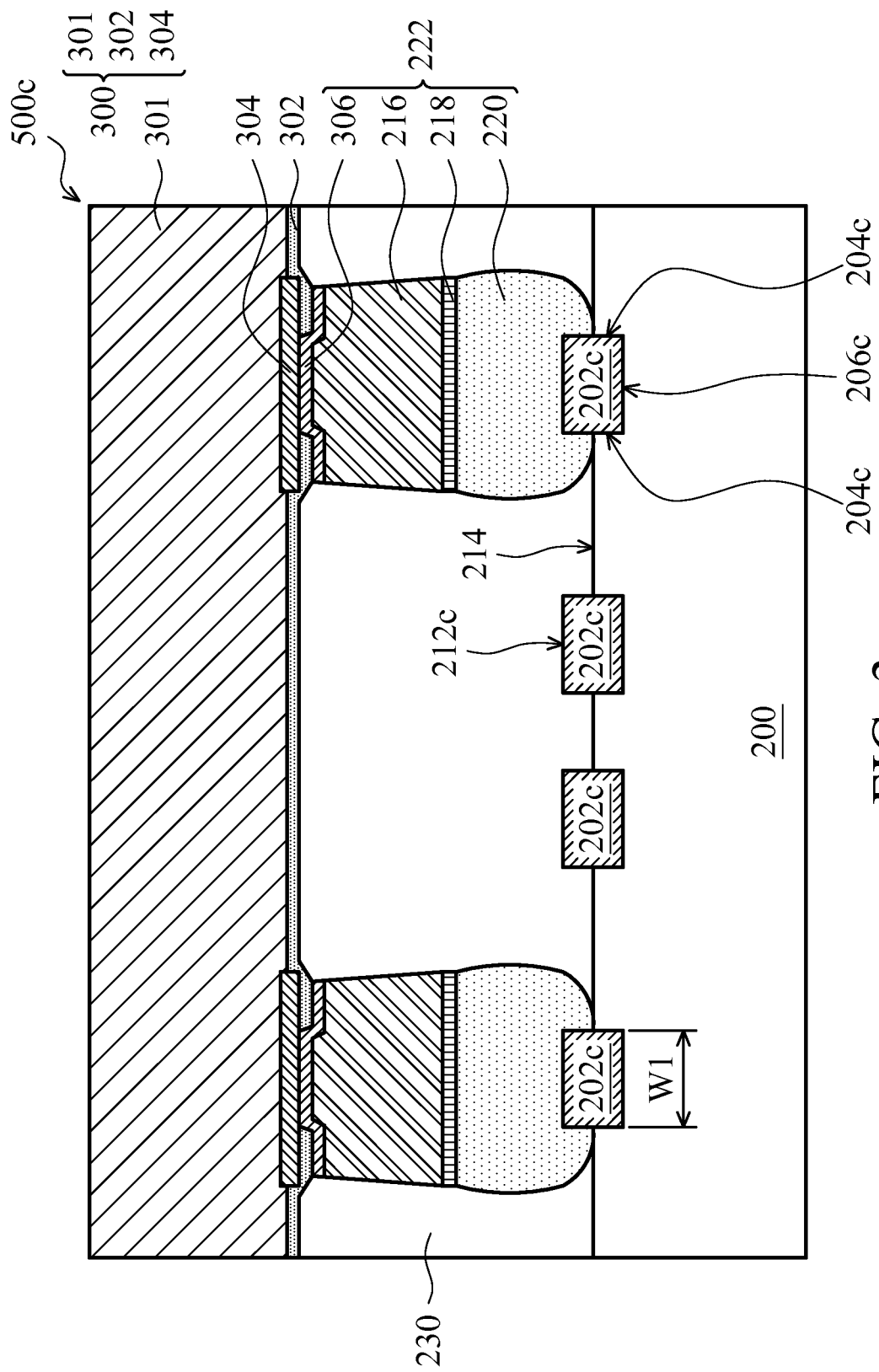

FIG. 3 shows a partial cross section of yet another exemplary embodiment of a semiconductor package 500c of the invention. Elements of the embodiments that are the same or similar as those previously described with reference to FIGS. 1 and 2, are hereinafter not repeated for brevity. In this embodiment, conductive traces 202c of the semiconductor package 500c embedded in the base 200 may have a top surface 212c designed above a device attach surface 214 of the base 200 to improve routing ability for high-density semiconductor packages. That is to say, a bottom surface 206c and only a portion of a sidewall 204c of the conductive trace 202c are designed to be connected to the base 200. Therefore, the solder cap 220 of the conductive structure 222 is disposed on the device attach surface 214 of the base 200, wrapping a top surface 212c and only a portion of the sidewall 204c of the conductive trace 202c.

Figure 4:
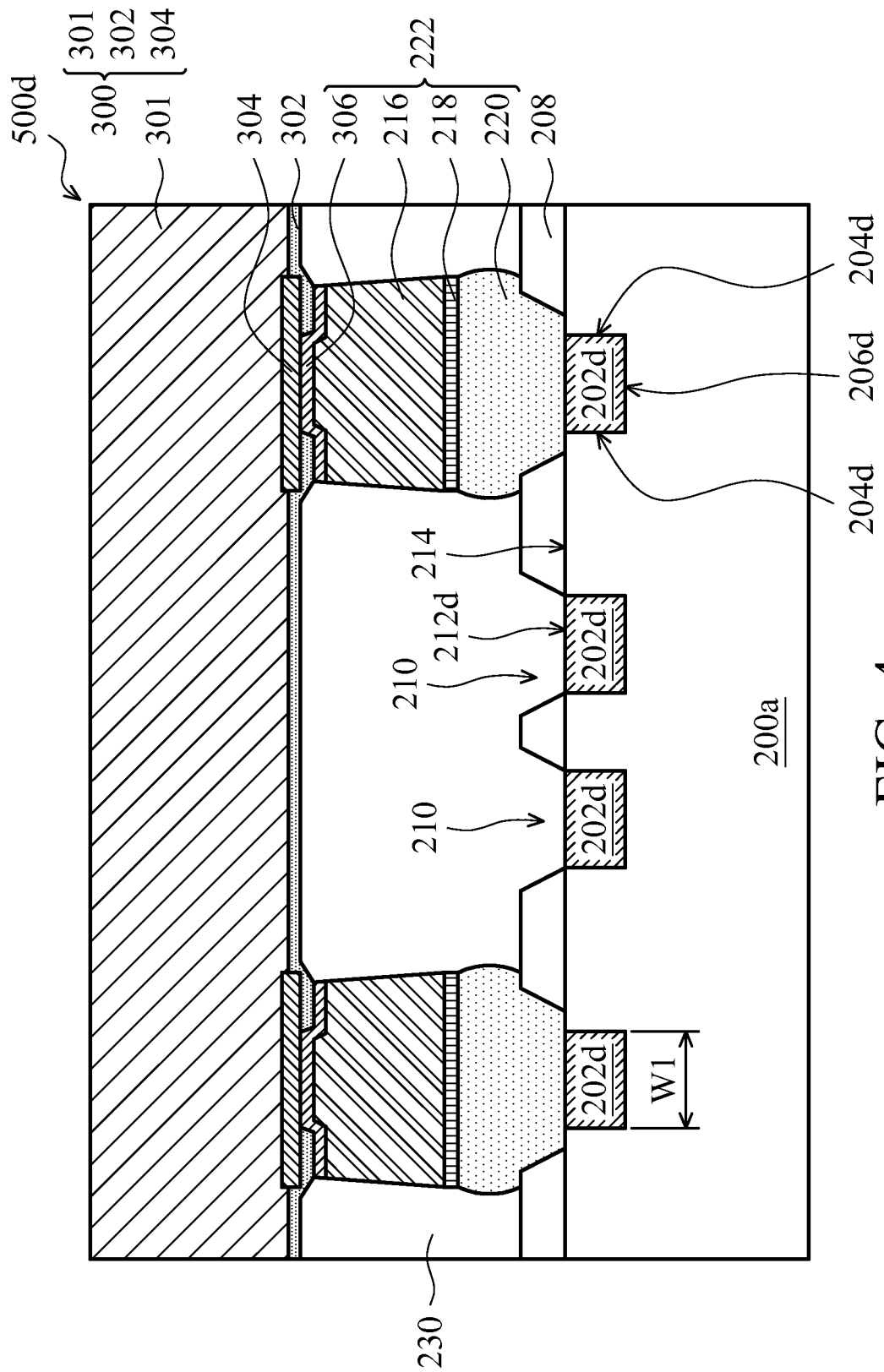

FIG. 4 shows a partial cross section of still another exemplary embodiment of a semiconductor package 500d of the invention. Elements of the embodiments that are the same or similar as those previously described with reference to FIGS. 1-3, are hereinafter not repeated for brevity. In one embodiment, the base may comprise a single layer structure as shown in FIGS. 1-3. Alternatively, the base may comprise a multilayer structure. In this embodiment, conductive traces 202d of the semiconductor package 500d embedded in the base portion 200a may have a top surface 212d designed to be aligned to a surface 214 of the base portion 200a to improve routing ability for high-density semiconductor packages. That is to say, a bottom surface 206d and a sidewall 204d of the conductive trace 202d are designed to be connected to the base portion 200a. Also, an insulation layer 208 having openings 210 is disposed on the base portion 200a. The insulation layer 208 is disposed above the device attach surface 214 of the conductive trace 202d. In this embodiment, the base portion 200a and the insulation layer 208 collectively serve as a multilayer base. As shown in FIG. 4, the conductive traces 202d are exposed within the openings 210. Therefore, the solder cap 220 of the conductive structure 222 is formed through a portion of the insulation layer 208, contacting a top surface 212d of the conductive trace 202d only. It should be noted that it is not necessary for the insulation layer 208 to align with the sidewall 204d of the conductive traces 202d. Instead, it can be designed to be distanced outward or inward from the sidewall 204d of the conductive traces 202d as shown in FIG. 4.

Figure 5A:
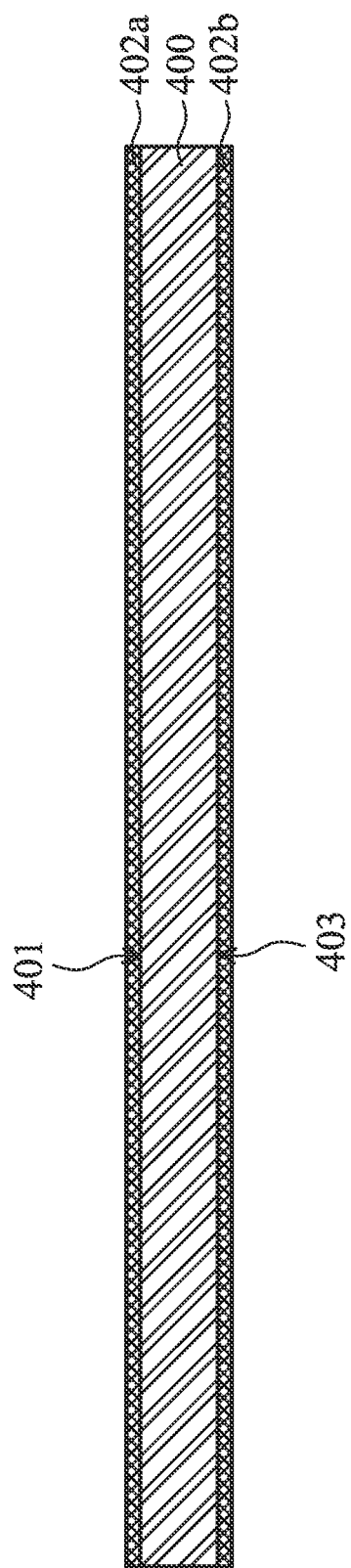

FIGS. 5a to 5d are cross sections showing one exemplary embodiment of a method for fabricating two bases 200c and 200d for a semiconductor package of the invention. In this embodiment, the method for fabricating bases for a semiconductor package is also called a double-sided base fabricating process. Elements of the embodiments that are the same or similar as those previously described with reference to FIGS. 1-4, are hereinafter not repeated for brevity. As shown in FIG. 5a, a carrier 400 with conductive seed layers 402a and 402b on a top surface 401 and a bottom surface 403 is provided. In one embodiment, the carrier 400 may comprise FR4 glass epoxy or stainless steel. Also, the conductive seed layers 402a and 402b are used as seed layers for subsequently formed interconnection conductive traces of bases on the top surface 401 and the bottom surface 403 of the carrier 400. In one embodiment, the conductive seed layers 402a and 402b may comprise copper.

Figure 5B:
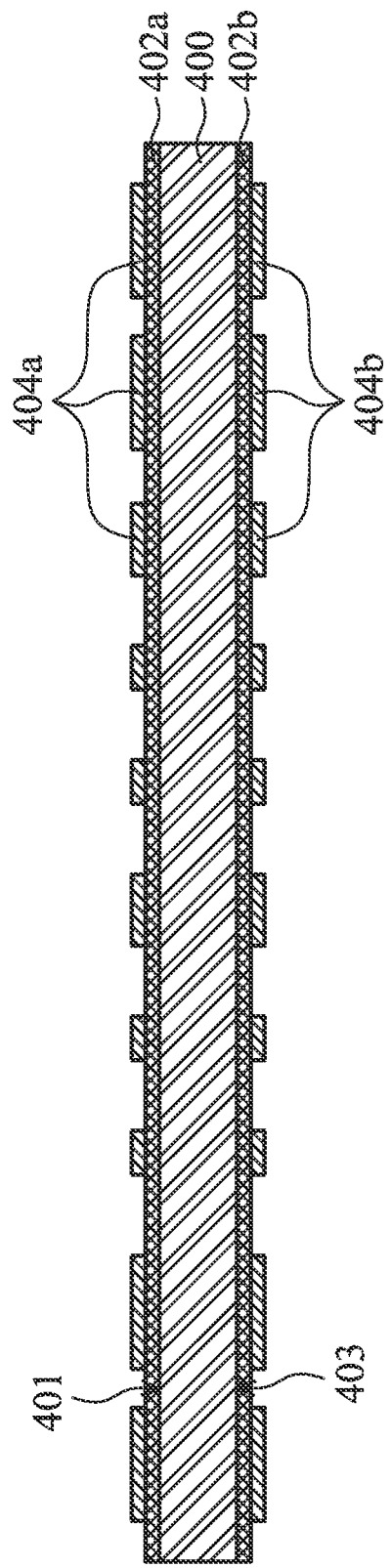

Next, as shown in FIG. 5b, first conductive traces 404a and 404b are respectively formed on the top surface 401 and the bottom surface 403 of the carrier 400. Bottom portions of the first conductive traces 404a and 404b connect to top portions of the conductive seed layers 402a and 402b. In one embodiment, the first conductive traces 404a and 404b may be formed by a plating process and an anisotropic etching process. The plating process and the anisotropic etching process are simultaneously performed on the top surface 401 and the bottom surface 403 of the carrier 400. In one embodiment, the plating process may comprise an electrical plating process. In one embodiment, the first conductive traces 404a and 404b may comprise copper. In one embodiment, the first conductive traces 404a and 404b are designed to have a width which is larger than 5 µm. However, it should be noted that there is no limitation on the width of the conductive traces. For different designs, the width of the conductive traces can be smaller than 5 µm if required. In this embodiment, the anisotropic etching process may precisely control the width of the first conductive traces 404a and 404b.

Figure 5C:
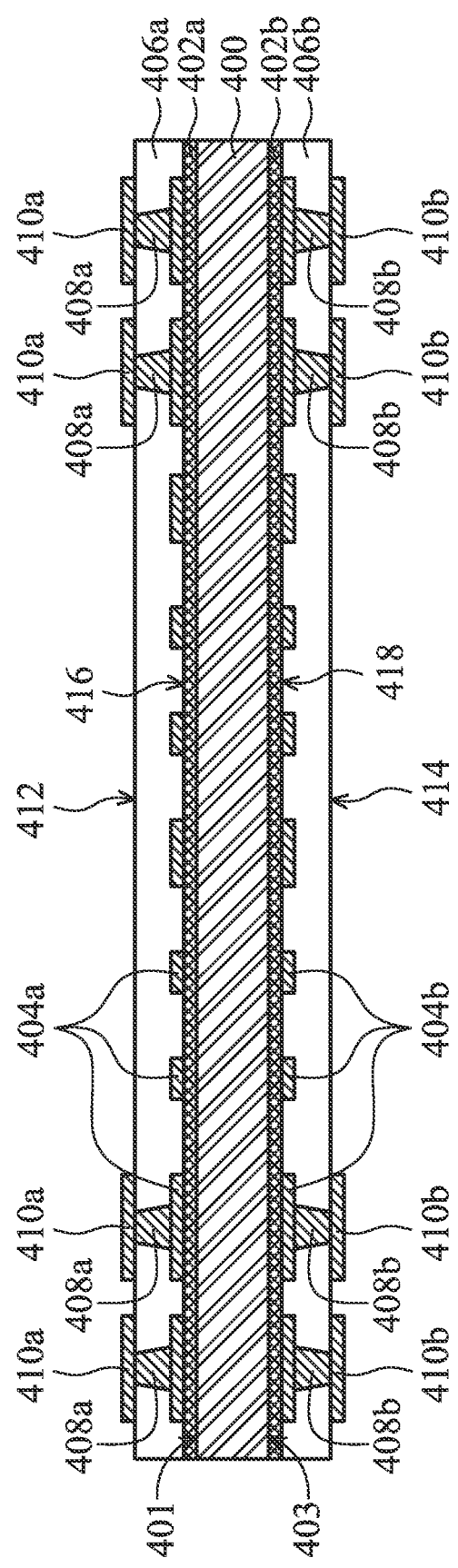

Next, as shown in FIG. 5c, a laminating process is performed to respectively dispose a first base material layer 406a and a second base material layer 406b on the top surface 401 and the bottom surface 403 of the carrier 400, wherein the first base material layer 406a and a second base material layer 406b respectively cover the first conductive traces 404a and 404b. In this embodiment, the laminating process of the first base material layer 406a and the second base material layer 406b is simultaneously performed on the on the top surface 401 and the bottom surface 403 of the carrier 400. In one embodiment, the first base material layer 406a and the second base material layer 406b may comprise polypropylene (PP).

Next, please refer to FIG. 5c again, wherein a drilling process is performed to form openings (not shown) through the first base material layer 406a and the second base material layer 406b to define the formation positions of subsequently formed vias 408a and 408b. In one embodiment, the drilling process may comprise a laser drilling process, an etching drilling process or a mechanical drilling process. Next, a plating process is performed to fill a conductive material into the openings to form vias 408a and 408b for interconnecting the first conductive traces 404a and 404b to subsequent second conductive traces 410a and 410b. In this embodiment, the drilling process and the plating process are simultaneously performed on the first base material layer 406a and the second base material layer 406b, respectively.

Next, please refer to FIG. 5c again, wherein a plurality of second conductive traces 410a and 410b are respectively formed on a first surface 412 of the first base material layer 406a and a first surface 414 of the second base material layer 406b. As shown in FIG. 5c, the first surface 412 of the first base material layer 406a and the first surface 414 of the second base material layer 406b are respectively away from the top surface 401 and the bottom surface 403 of the carrier 400. The second conductive traces 410a and 410b are formed by a plating process and an anisotropic etching process. The plating process and the anisotropic etching process are simultaneously performed on the first surface 412 of the first base material layer 406a and the first surface 414 of the second base material layer 406b. In one embodiment, the plating process may comprise an electrical plating process. In one embodiment, the second conductive traces 410a and 410b may comprise copper. In one embodiment, the second conductive traces 410a and 410b are designed to have a width which is larger than 5 nm. However, it should be noted that there is no limitation on the width of the conductive traces. For different designs, the width of the conductive traces can be smaller than 5 nm if required. In this embodiment, the anisotropic etching process may precisely control the width of the second conductive traces 410a and 410b.

Next, as shown in FIG. 5d, the first base material layer 406a with the first and second conductive traces 404a and 410a thereon and the second base material layer 406b with the first and second conductive traces 404b and 410b thereon are respectively separated from the top surface 401 and the bottom surface 403 of the carrier 400 to form a first base 200c and a second base 200d which are separated from each other. Next, as shown in FIG. 5d again, the conductive seed layers 402a and 402b are removed from the first base 200c and the second base 200d, respectively.

As shown in FIGS. 5d and 5e, the first conductive traces 404a and 404b are aligned to second surfaces 416 and 418 of the of the first and second bases 200c and 200d, which are respectively opposite to the first surfaces 412 and 414. In this embodiment, the first base 200c and the second base 200d are simultaneously fabricated on opposite surfaces (the top surface 401 and the bottom surface 403) by the double-sided base fabricating process.

Alternatively, two passivation or insulation layers (not shown) having openings may be optionally formed respectively on a second surface 416 of the first base 200c and the second surface 418 of the second base 200d after the separation of the first base 200c and the second base 200d as shown in FIGS. 5d and 5e. In this embodiment, the first conductive traces 404a and 404b of the first and second bases 200c and 200d are exposed within the opening. Positions of the insulation layer with openings and the first conductive traces 404a/404b as shown in FIG. 5d/5e can be similar to the insulation layer 208 with openings 210 and the conductive traces 202d as shown in FIG. 4. Also, in this embodiment, the first base 200a/second base 200b and the insulation layer thereon collectively serve as a multilayer base.

Figure 6A:
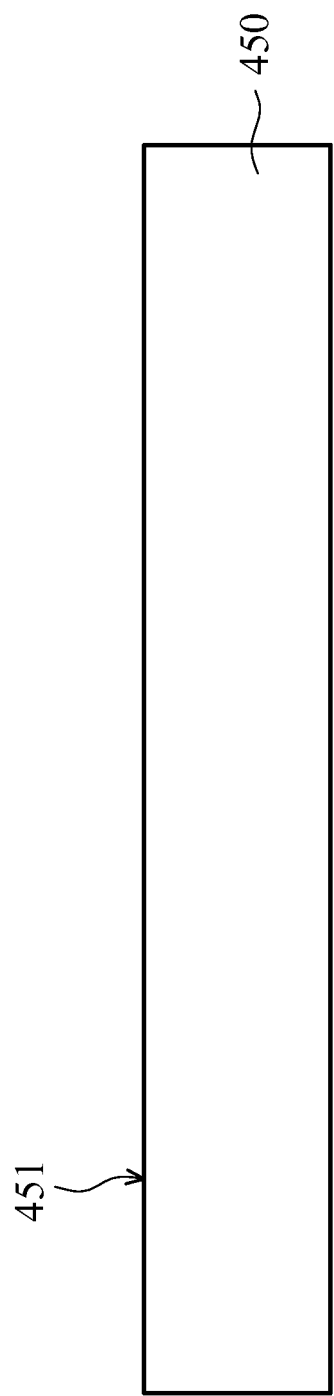
FIGS. 6a to 6e are cross sections showing another exemplary embodiment of a method for fabricating a semiconductor package of the invention.
Figure 6B:
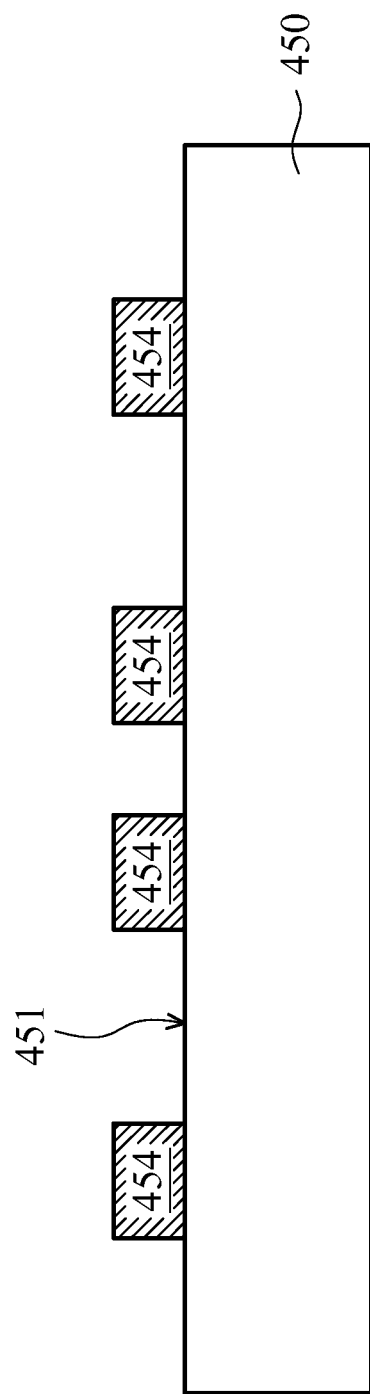
Figure 6C:
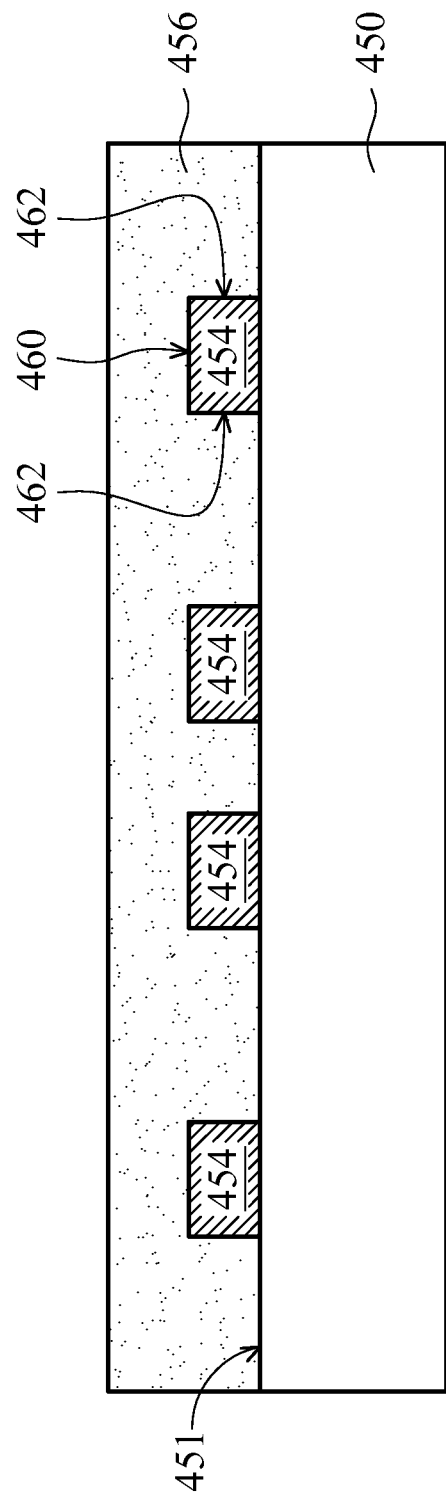
Figure 6D:
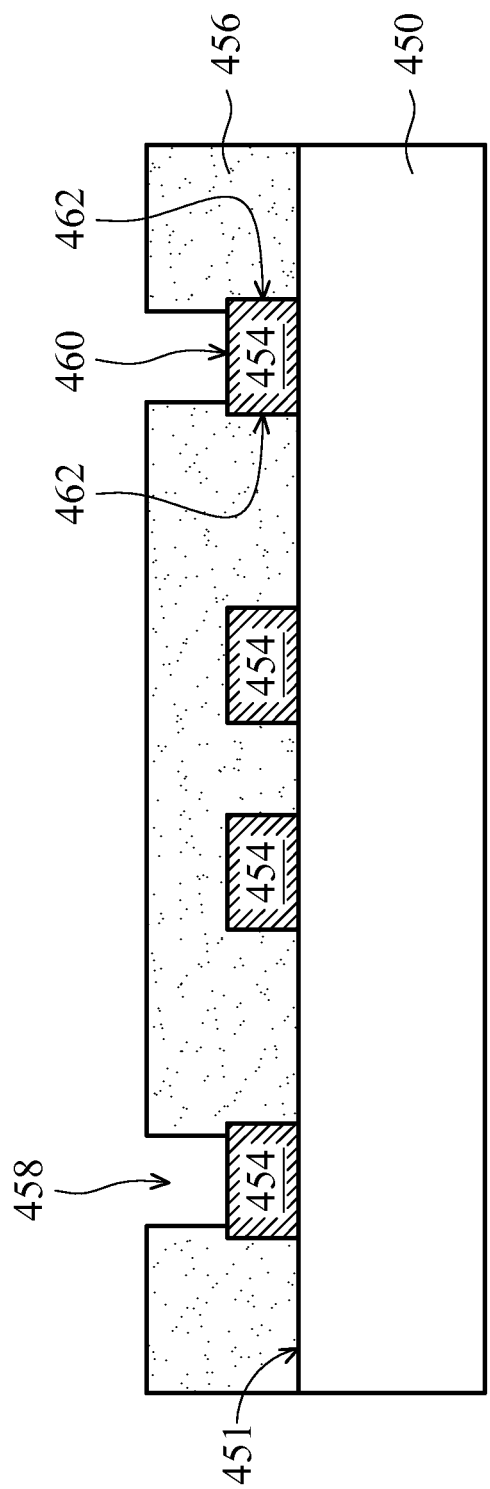
Figure 6E:
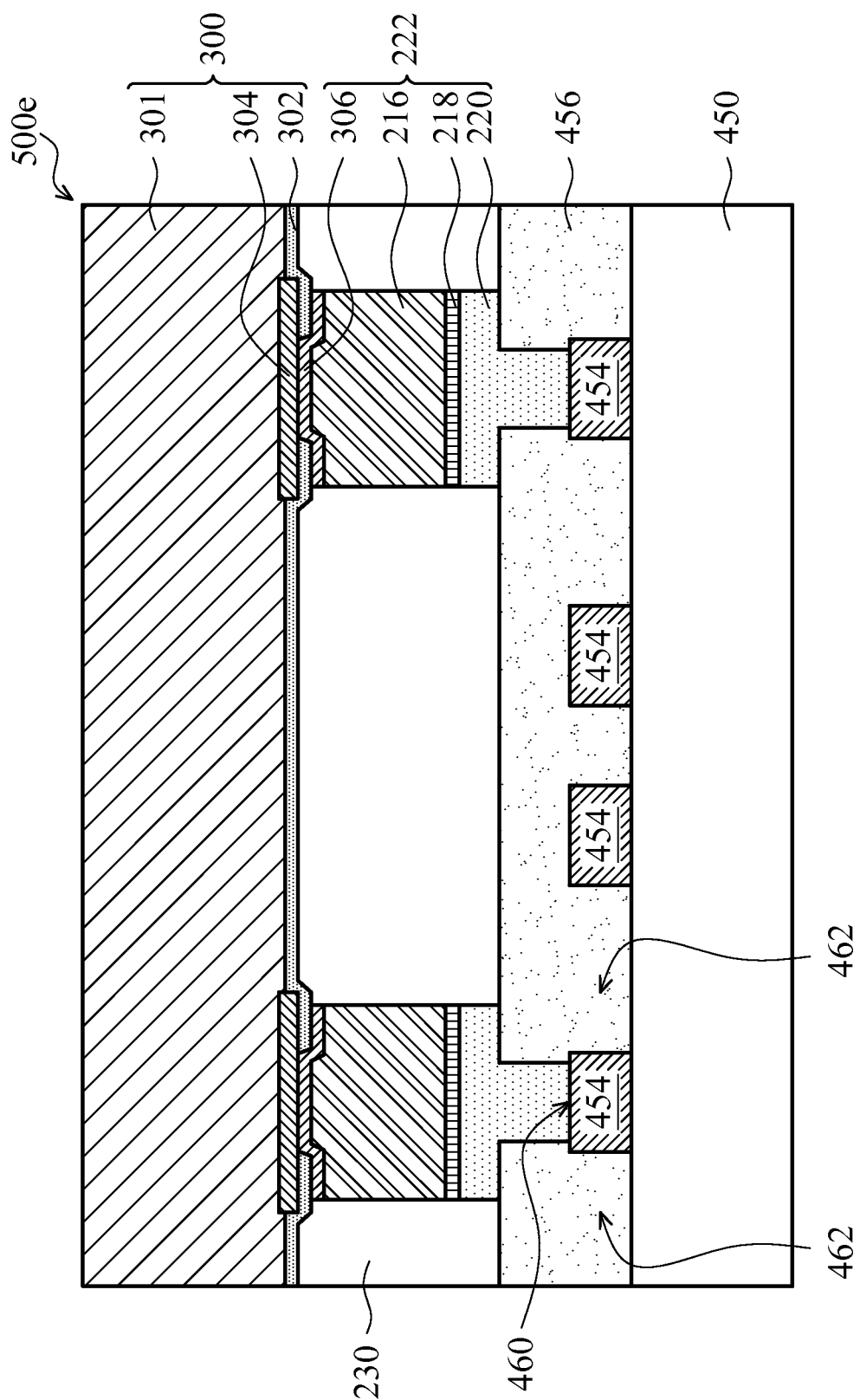
Figure 7C:
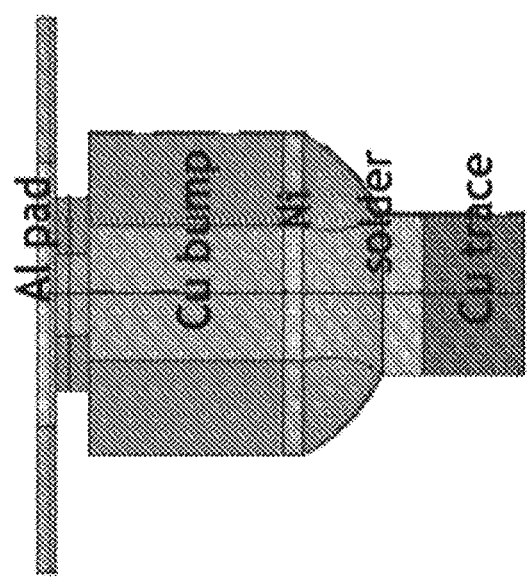
FIGS. 7a to 7c show solder and a Cu bump disposed over an elongated Cu trace.
Figure 7B:
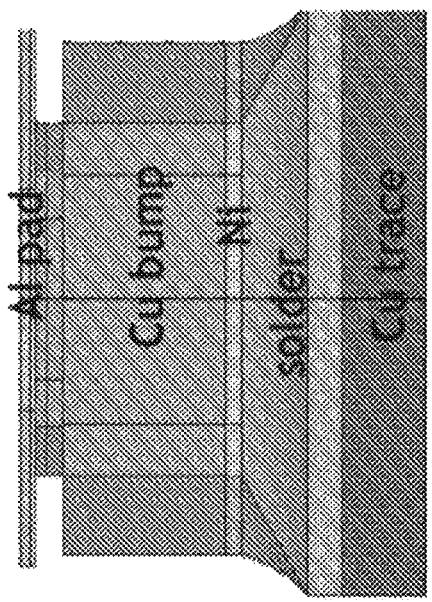
Figure 7A:
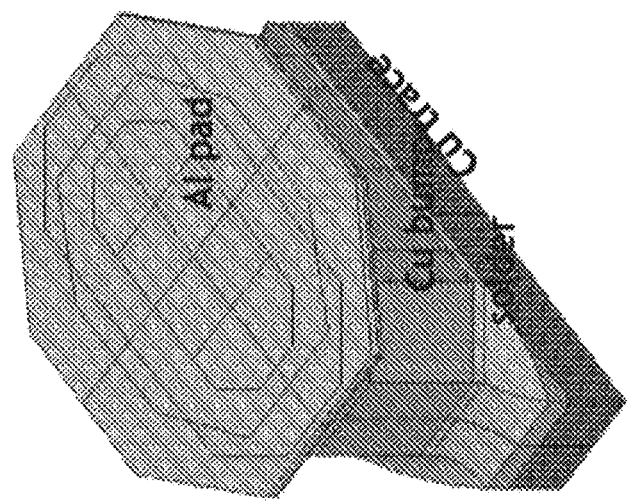

FIGS. 6a to 6e are cross sections showing another exemplary embodiment of a method for making a semiconductor package of the invention. Also, FIG. 6e shows a cross section of another exemplary embodiment of a semiconductor package 500e of the invention. Elements of the embodiments that are the same or similar as those previously described with reference to FIGS. 1-4 and 5a-5e, are hereinafter not repeated for brevity. Alternatively, the base may have a multilayer structure. As shown in FIG. 6a, a base 450 with a top surface 451 is provided. Next, as shown in FIG. 6b, at least one conductive trace 454 is formed on the top surface 451 of the base 450. In one embodiment, the conductive trace 454 may be formed by a plating process and an anisotropic etching process. In one embodiment, the plating process may comprise an electrical plating process. In one embodiment, the conductive trace 454 may comprise copper. In one embodiment, the conductive trace 454 is designed to have a width which is larger than 5 μm. However, it should be noted that there is no limitation on the width of the conductive traces. For different designs, the width of the conductive traces can be smaller than 5 μm if required. In this embodiment, the anisotropic etching process may precisely control the width of the conductive trace 454.

Next, as shown in FIG. 6c, a laminating process is performed to respectively dispose an additional insulation material 456 on the top surface 451 of the base 450. Also, the additional insulation material 456 covers a top surface 460 and sidewalls 462 of the conductive trace 454.

Next, please refer to FIG. 6d, wherein a drilling process is performed to form at least one opening 458 through the additional insulation material 456 to define formation of a position of a subsequently formed conductive structure, for example, a copper bump structure or a solder bump structure. In one embodiment, the drilling process may comprise a laser drilling process, an etching drilling process or a mechanical drilling process. In this embodiment, the top surface 460 of the conductive trace 454 is exposed within the opening 458 of the additional insulation material 456.

Next, as shown in FIG. 6e, a bonding process is performed to mount a semiconductor device 300 on the base 450 through the conductive structure 222. Elements of the semiconductor device 300 and the conductive structure 222 that are the same or similar as those previously described with reference to FIGS. 1-4, are hereinafter not repeated for brevity. After the bonding process, the conductive structures 222 are disposed through the opening 458 of the additional insulation material 456, contacting to the top surface 460 of the conductive trace 454 only. Next, an underfill material or the underfill 230 can be introduced into the gap between the semiconductor device 300 and the additional insulation material 456. In one embodiment, the underfill 230 may comprises a capillary underfill (CUF), molded underfill (MUF) or a combination thereof. Finally, the base 450, the additional insulation material 456, the semiconductor device 300, the conductive trace 454, and the conductive structure 222 collectively form a semiconductor package 500e.

Exemplary embodiments provide a semiconductor package. The semiconductor package is designed to comprise conductive trace embedded in a base, for example, a print circuit board (PCB). The conductive traces may have a top surface disposed above, below or aligned to a surface of the base to improve routing ability for high-density semiconductor packages. Also, the conductive traces are designed to have a width which is larger than 5 nm. Further, the base may comprise a single layer structure or a multilayer structure. Exemplary embodiments also provide a method for fabricating a base for a semiconductor package. In one embodiment, the method can fabricate two bases on two sides of a carrier simultaneously. Also, the conductive traces may be embedded in the base. Further, the conductive trace may be formed by a plating process and an anisotropic etching process, and the anisotropic etching process may precisely control the width of the conductive trace. Alternatively, the method can fabricate a base comprising a single layer structure or a multilayer structure to improve design capability.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A semiconductor package, comprising:
a conductive trace, having a bottom surface and at least a portion of a sidewall connected to a base, wherein the bottom surface and the at least a portion of the sidewall are in contact with a base material; and a semiconductor device mounted on the conductive trace via a conductive structure comprising a solder cap in contact with the conductive trace, wherein an entirety of the bottom surface of the conductive trace under the conductive structure is covered with the base material, and wherein a bottom surface of the solder cap in contact with the conductive trace is below a portion of the base material, and wherein the conductive trace is elongated and carries a signal or a ground across at least a portion of the base.

2. A semiconductor package, comprising:
a conductive trace embedded in a base; and
a conductive structure in contact with the conductive trace; and
a semiconductor device mounted above the conductive trace and connected to the conductive structure,
wherein an entirety of a bottom surface of the conductive trace under the conductive structure is covered with insulating material, wherein the base comprises the insulating material and the insulating material comprises polypropylene, and
wherein the conductive trace is elongated and carries a signal or a ground across at least a portion of the base.

3. A semiconductor package, comprising:
a base comprising an insulating material;
a conductive trace embedded in the base; and
a conductive structure comprising a solder cap in contact with an entire width of a top surface of the conductive trace; and
a semiconductor device mounted above the conductive trace and connected to the conductive structure,
wherein an entirety of a bottom surface of the conductive trace under the conductive structure is covered with the insulating material, and
wherein a bottom surface of the solder cap in contact with the conductive trace is below a portion of the insulating material in the base, and
wherein the conductive trace is elongated and carries a signal or a ground across at least a portion of the base.

4. The semiconductor package as claimed in claim 3, wherein the conductive trace has a width which is larger than 5 µm.

5. The semiconductor package as claimed in claim 3, wherein the conductive structure contacts the top surface of the conductive trace only.

6. The semiconductor package as claimed in claim 3, wherein the conductive structure wraps around a top surface and a portion of a sidewall of the conductive trace.

7. The semiconductor package as claimed in claim 3, wherein the conductive structure is connected to at least a portion of the base.

8. The semiconductor package as claimed in claim 3, wherein the semiconductor device comprises a die, a passive component, a package or a wafer level package.

9. The semiconductor package as claimed in claim 3, wherein the conductive structure comprises a copper bump or solder bump structure.

10. The semiconductor package as claimed in claim 3, wherein the base comprises a single layer structure or a multilayer structure.

11. The semiconductor package as claimed in claim 3, wherein:
the conductive structure is disposed between the base and the semiconductor device,
the conductive trace is disposed between the base and the conductive structure such that a substantial entirety of the bottom surface of the conductive trace under the conductive structure contacts the base and a portion of a second surface of the conductive trace contacts the conductive structure, and
the bottom surface of the conductive trace is opposite the second surface of the conductive trace.

12. The semiconductor package of claim 3, wherein the conductive trace is a single layer.

13. The semiconductor package as claimed in claim 3, wherein the conductive trace has a longest dimension that runs perpendicular to a longest dimension of the conductive structure.

14. The semiconductor package as claimed in claim 3, wherein:
the base comprises a printed circuit board, and
the base covers an entirety of the bottom surface of the conductive trace under the conductive structure, the bottom surface of the conductive trace being opposite the conductive structure relative to the conductive trace.

15. The semiconductor package as claimed in claim 3, wherein the top surface of the conductive trace is below a surface of the base.

16. The semiconductor package as claimed in claim 15, further comprising:
an insulation layer having an opening disposed on the base, above the top surface of the conductive trace, wherein the conductive trace is exposed within the opening.

17. The semiconductor package as claimed in claim 3, further comprising:
an underfill between the semiconductor device and the base.

18. The semiconductor package as claimed in claim 17, wherein the underfill comprises capillary underfill (CUF), molded underfill (MUF), nonconductive paste (NCP), nonconductive film (NCF) or a combination thereof.

19. The semiconductor package as claimed in claim 3, wherein the conductive structure comprises a conductive pillar structure.

20. The semiconductor package as claimed in claim 19, wherein the conductive pillar structure is composed of a metal stack comprising an under bump metallurgy (UBM) layer, a copper layer, and the solder cap.

21. The semiconductor package as claimed in claim 20, wherein the conductive pillar structure further comprises a conductive buffer layer between the copper layer and the solder cap.

* * * * *